United States Patent [19]

Rao

[11] Patent Number: 5,200,922

[45] Date of Patent: Apr. 6, 1993

[54] REDUNDANCY CIRCUIT FOR HIGH SPEED EPROM AND FLASH MEMORY DEVICES

[76] Inventor: Kameswara K. Rao, 1172 Arlington La., San Jose, Calif. 95129

[21] Appl. No.: 602,999

[22] Filed: Oct. 24, 1990

[51] Int. Cl.$^5$ .............................................. G11C 11/40
[52] U.S. Cl. ................................ 365/200; 365/225.7; 365/230.06
[58] Field of Search ................... 365/200, 210, 230.06, 365/225.7; 371/10.1, 10.3

[56] References Cited

U.S. PATENT DOCUMENTS

| | | | |
|---|---|---|---|
| 3,331,058 | 7/1967 | Perkins, Jr. | |
| 3,348,218 | 10/1967 | Vinal | 365/200 |
| 3,584,183 | 6/1971 | Chiaretta et al. | 219/121 |
| 3,599,146 | 8/1971 | Weisbecker | 340/146.1 |
| 3,654,610 | 4/1972 | Sander et al. | 365/49 |
| 3,721,838 | 3/1973 | Brickman et al. | 307/303 |
| 3,740,523 | 6/1973 | Cohen et al. | 219/121 LM |
| 3,898,443 | 8/1975 | Smith | 371/10.3 |
| 3,940,740 | 2/1976 | Coontz . | |
| 3,959,047 | 5/1976 | Alberts et al. | 156/8 |
| 4,089,063 | 5/1978 | Takezono et al. | 365/200 |
| 4,093,985 | 6/1978 | Das | 364/200 |
| 4,130,889 | 12/1978 | Chua | 365/96 |
| 4,228,528 | 10/1980 | Cenker et al. | 365/200 |
| 4,250,570 | 2/1981 | Tsang et al. | 365/200 |
| 4,266,285 | 5/1981 | Panepinto, Jr. | 365/200 |
| 4,281,398 | 7/1981 | McKenny et al. | 365/200 |
| 4,720,817 | 1/1988 | Childers | 365/200 |
| 4,757,474 | 7/1988 | Fukushi et al. | 365/200 |
| 4,903,237 | 2/1990 | Rao | 365/185 |

FOREIGN PATENT DOCUMENTS 1398438 6/1979 United Kingdom .

OTHER PUBLICATIONS

"Redundant Memory Cell and Decoder", by N. F. Brickman, IBM Technical Disclosure Bulletin, vol. 13, No. 7, Dec. 1970, pp. 1924–1926.

"Selective Metalization Removal for Redundancy", by S. E. Schuster, IBM Technical Disclosure Bulletin, vol. 15, No. 2, Jul. 1972, pp. 551–552.

*Primary Examiner*—Joseph A. Popek
*Attorney, Agent, or Firm*—Skjerven, Morrill, MacPherson, Franklin & Friel

[57] ABSTRACT

A redundancy control circuit enables the redundancy of a row or a column in a memory array such that no degradation in access time occurs. The redundancy circuit is further configured such that negligible power is consumed by the circuit during both a standby mode and a redundancy enable mode.

4 Claims, 7 Drawing Sheets

REDUNDANCY CIRCUIT FOR HIGH SPEED EPROM AND FLASH MEMORY DEVICES

BACKGROUND OF THE INVENTION

1. Field of the Invention

The invention relates to the field of memory arrays and more particularly to redundancy circuitry for large scale integrated circuit memories such as EPROMs and flash memory devices.

2. Description of the Relevant Art

A memory array such as a programmable read-only memory array (PROM) or a random access memory array (RAM) generally comprises an array of programmable binary elements arranged in a matrix of rows and columns having addresses associated therewith and decoders coupled thereto. The binary elements in the RAM can be both written into and read out of, whereas the binary elements in the PROM are either permanently or semi-permanently programmed to one of two states such that information stored in the memory can only be read out.

Figure 1:
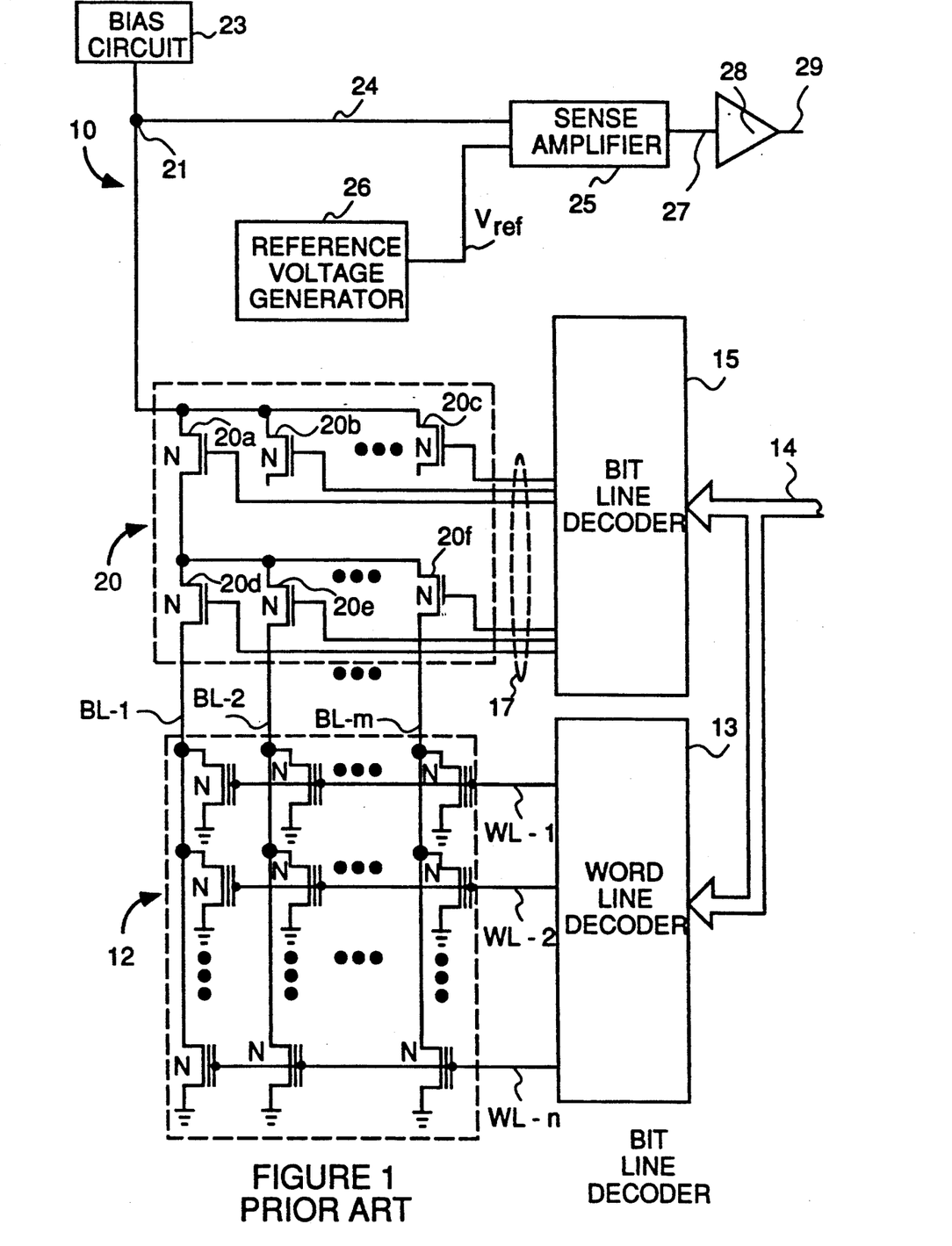
FIG. 1 (Prior Art) shows a diagram of a typical EPROM integrated circuit chip having a memory cell array.

FIG. 1 illustrates an EPROM (Erasable Programmable Read-Only Memory) circuit 10 including an array of floating gate transistors 12 arranged in rows and columns. Each row is coupled to one of word lines WL-1 to WL-n and each column is coupled to one of bit lines BL-1 to BL-m. A word line decoder 13 receives a first group of address signals on an address bus 14 and drives one of word lines WL-1 to WL-n in response thereto, while a bit line decoder 18 receives a second group of address signals on address bus 14 and selects one of bit lines BL-0 to BL-m in response thereto. Bit line decoder 15 drives a group of output lines 17 that are connected to N-channel field effect transistors 20. For any given address, only one of the word lines WL-1 to WL-n is selected by word line decoder 13, and only one of bit lines BL-1 to BL-m is selected by bit line decoder 15. When a particular row of word lines WL-1 to WL-n is selected, each of the corresponding transistors 12 within the selected row provides either a low impedance path to ground (from drain to source) if it is erased (threshold voltage low), or a high impedance path to ground if it is programmed (threshold voltage high).

It should be noted that each transistor 12 within the memory array is referred to as a "cell". It is further appreciated, as known to those skilled in the art, that each of the floating gate transistors 12 can be programmed electrically by applying a high voltage on the drain and the select gate of the device, thus allowing current to flow to the source and resulting in negative charging of the floating gate. Furthermore, for the EPROM circuit 10, the transistors 12 are erased by exposing the memory array to ultraviolet light to thereby electrically neutralize the floating gate. In alternative memory array structures such as flash memory devices or E²PROMs (Electrically Erasable Programmable Read-Only Memory), erasing of each memory cell is achieved electronically. When a particular memory cell transistor 12 is programmed, its threshold voltage is high, e.g. above 5 volts. When a particular memory cell transistor 12 is erased, its threshold voltage is low, e.g. from approximately 1 to 2 volts.

Transistors 20 collectively form a circuit referred to as a column select circuit. Included within transistors 20 are transistors 20a–20c having drains coupled to a node 24. The source connections of transistors 20b and 20c are not shown to simplify the illustration, but the sources of transistors 20b and 20c are typically connected to a set of bit line decode transistors such as transistors 20d, 20e and 20f, which in turn are coupled to associated bit lines BL-1 to BL-m. When one column of bit lines BL-1 to BL-m is selected by bit line decoder 15, the pair of corresponding transistors 20 connected to the selected column (bit line) are turned on, therefore selectively coupling those particular transistors 12 to the node 21. For example, for an appropriate predetermined address signal on address bus 14, bit line decoder 15 generates high signals at the gates of transistors 20a and 20d, thereby turning the devices on and causing selection of bit line BL-1.

The selected bit line BL-1 to BL-m coupled through the pair of corresponding transistors 20 to node 21 is biased by a bias circuit 23. Node 21 is further coupled to a first input lead 24 of a sense amplifier 25. When it is desired to read data stored in a selected transistor 12, the voltage at the word line WL-1 to WL-n connecting the control gate of the selected transistor 12 is raised, e.g., to about 5 volts. If the floating gate of the selected transistor 12 is electrically neutral and thus erased, the voltage at input lead 24 goes low when the voltage at the control gate increases and the selected transistor 12 turns on. If the floating gate is negatively charged and thus programmed, the voltage at input lead 24 remains high. Sense amplifier 25 compares the voltage at input lead 24 to a reference voltage $V_{ref}$ provided by a reference voltage generator 26 and generates therefrom an output signal on the output lead 27 in response thereto. The signal on output lead 27 is communicated via a tri-state buffer 28 to an output pin 29.

Large scale integration techniques have made possible the construction of memory devices having large arrays of binary storage elements such as transistors 12 on a single chip of silicon or other substrate. The immediate advantages of such arrangements are the high cell density and low power requirements. However, in the production of integrated circuit chips, it is not unusual for the yield of flawless chips processed from a silicon wafer to be low, especially during early production runs. For each perfect chip produced, there are a number of chips that are almost perfect, having one or more localized defects which render unusable a single cell or a few closely associated cells or clusters of cells.

As cell density increases, it follows that the likelihood of processing defects also increases. The problem of processing defects has been especially troublesome in the fabrication of matrix memory devices. On one hand, innovations in computer technology have made desirable the production of larger memories, and it is possible to fabricate these larger memories on a single wafer. However, if the error or defect rate is high, the cost of producing the larger memory can be excessive due to defective cells. On the other hand, the cost of producing smaller, individual memory components which then must be interconnected utilizing circuit boards and wiring is also undesirably high. It will be appreciated that the presence of only one defective cell in an otherwise perfect memory array can render useless the entire memory array. Therefore, there is a continuing interest in techniques for improving the yield of perfect arrays, and for repairing or otherwise rendering usable those memory arrays having processing defects.

Many techniques have been advanced for improving yield. For example, error correction codes have been used to correct words read from a memory array in which certain bits of the word are stored in defective cells.

Additionally, defect tolerant memory systems have been disclosed in which an entire redundant row or column of cells is substituted for a selected row or column containing one or more defective cells. One such memory redundancy system employs fusible silicon links which present a low impedance path when intact or a high impedance path when blown and thereby allow defective rows or columns to be bypassed. The memory redundancy system utilizing the fusible link technique however requires that both the memory connections and external connections thereto be rewired such that redundant rows and columns can be coupled into the processing circuitry in place of the defective row and column if the same address is to be retained. This requirement increases mass production costs.

In yet another arrangement, a cell addressable array utilizes a redundant row or column of cells together with a defective word address register and a comparator circuit for disabling a defective row (or column) of cells and replacing it with a redundant row (or column) of cells. For such an arrangement, when the word in the address of a defective cell is requested, the comparator circuitry recognizes the address as corresponding to a defective cell and thereby provides a new address which corresponds to the redundant row which stores the correct word for access. Although such an arrangement is advantageous because the memory does not need rewiring and a physical fuse need not be blown, the access time of the memory is increased due to the comparator circuitry, and in addition, power consumption is increased.

The access time of a large scale integrated circuit memory is the time delay between the time at which the address change occurs or the chip enable active occurs to the time at which valid data from the requested location is provided at an output bus. With advances in scaling and design innovations, the access times for recent memories have been decreasing. EPROM access times typically in the 450 nanoseconds range a few years ago have decreased to less than 100 nanoseconds. The time required for access as a result of prior art redundancy techniques has therefore become significant with respect to the overall access time of the memory.

A memory circuit having a decreased access time and a reduced power consumption is desirable.

SUMMARY OF THE INVENTION

A redundancy control circuit for a memory system according to the present invention enables the redundancy of a row or column in a memory array such that no degradation in access time occurs due to the inclusion of the redundancy. Access time increases due to the redundancy circuitry are eliminated since a programmable fuse circuit for selecting a redundant row has a latched voltage output signal before, during, and after a chip select pulse is asserted. The redundancy control circuit is further configured such that negligible power is consumed by the circuit during both the standby mode and the enabled mode of the memory system.

These and other advantages are achieved with the circuit of the present invention, in accordance with which a memory circuit includes an array of memory cells, a row decoder for selecting a word line of the array of memory cells, and a column decoder for selecting a bit line of the array of memory cells. The memory circuit further comprises a plurality of redundant cells, and a redundant decoder coupled to the plurality of redundant cells for providing a select signal to the redundant cells to selectively read data stored in one of the plurality of redundant cells. In addition, a programmable address select circuit is coupled to the redundant decoder for providing a signal to the redundant decoder when a selected address is provided to the programmable address select circuit. Finally, an enable-disable circuit is further coupled to the redundant decoder for either enabling or disabling the redundant decoder.

The memory circuit may further include a disable decoder circuit for disabling the row decoder when the redundant decoder provides the redundancy select signal to the redundant cells. In addition, the address select circuit and the enable-disable circuit may comprise one or more floating gate transistors.

In accordance with another aspect of the invention, a control circuit is provided for enabling a reading operation of a plurality of redundant cells in a memory circuit. The memory circuit includes an array of memory cells as well as a memory array decoding circuit coupled to the memory array and connectable to a plurality of addressing lines. The control circuit comprises a redundant cell decoding circuit coupled to the plurality of redundant cells for providing a select signal to the redundant cells. In addition, an address select circuit is coupled to the redundant cell decoding circuit and is connectable to the plurality of addressing lines. The address select circuit includes a first means for programming the address select circuit to provide an address select signal to the redundant cell decoding circuit in response to an address signal at the addressing lines. Finally, an enable-disable circuit is coupled to the redundant cell decoding circuit and includes a second means for programming the enable-disable circuit to provide an enable signal to the redundant cell decoding circuit.

The address select circuit and the enable-disable circuit may be programmed by a programmable fuse circuit. The programmable fuse circuit comprises a first programmable element, such as a floating gate transistor. The fuse circuit further includes an enable input line coupled to the first programmable element for receiving a chip select pulse and an output line coupled to the first programmable element. A first voltage level is latched at the output line when the first programmable element is programmed in a first state, and a second voltage level is latched at the output line when the first programmable element is programmed in a second state.

The invention will be more readily understood by reference to the drawings and the detailed description. As will be appreciated by one skilled in the art, the invention is applicable to memory circuitry having redundancy in general, and is not limited to the specific embodiment disclosed.

DETAILED DESCRIPTION

The following is a detailed description of the best presently contemplated mode for carrying out the invention. The description is intended to be merely illustrative of the invention and should not be taken in a limiting sense.

Figure 2:
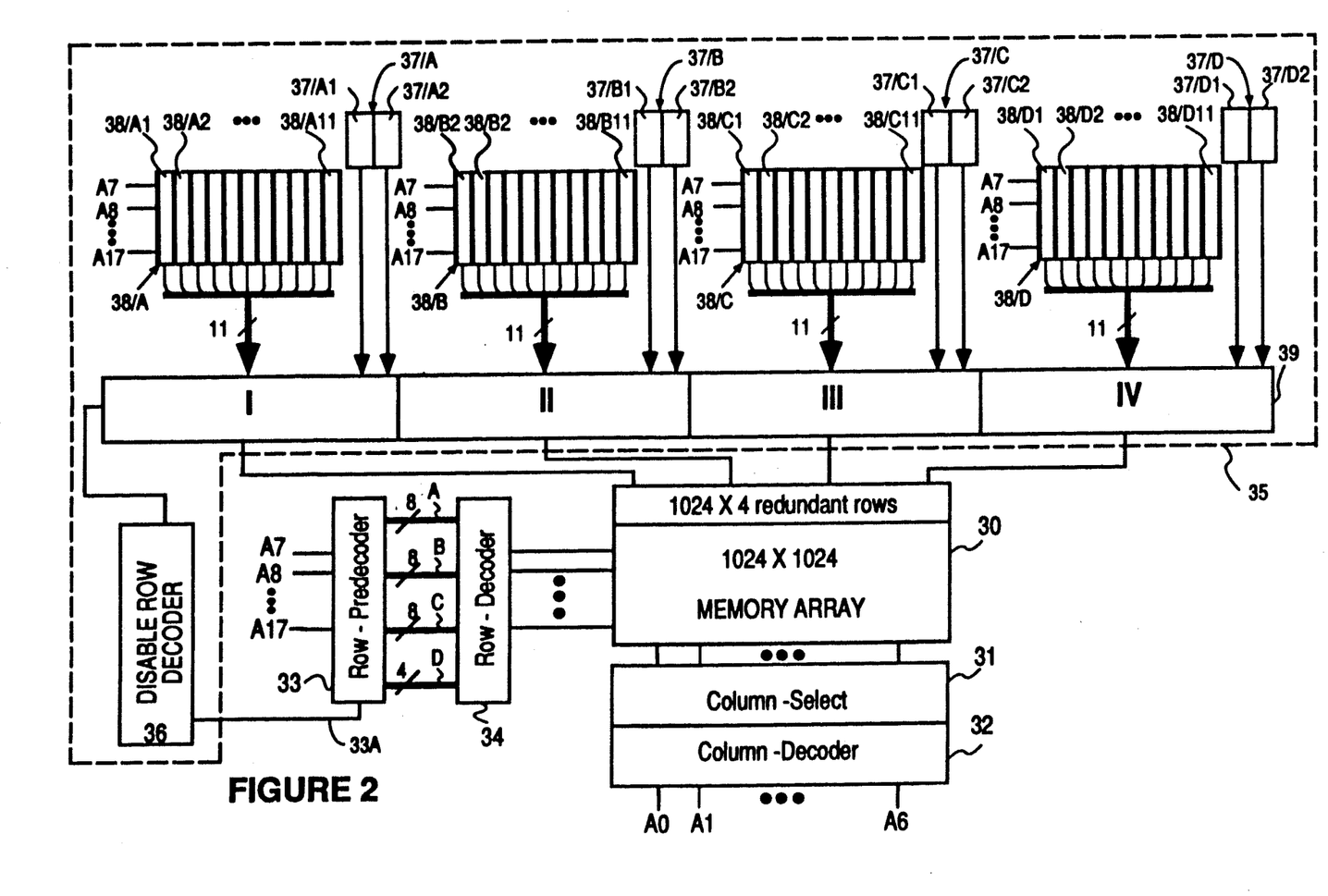
FIG. 2 shows a block diagram of an integrated circuit memory chip that incorporates a redundancy control circuit in accordance with the invention.

Referring to FIG. 2, a block diagram is shown of an integrated circuit memory chip that incorporates a redundancy control circuit in accordance with the invention. The memory chip in this particular implementation of the invention has a one mega-bit memory capability, although the invention may be adapted to a memory system of any size. The memory chip includes a memory array block 30 having 1024 rows of memory cells and 1024 columns of memory cells. Memory array 30 also includes four redundant rows of 1024 memory cells.

The memory chip block diagram of FIG. 2 also shows a column select circuit 31 and a column decoder circuit 32. Column decoder 32 is a bit line decoder (similar to that explained with reference to FIG. 1) and has seven address input lines A0–A6 that are connectable to the seven low order addressing bits of a system address bus. During operation, column decoder circuit 32 decodes the address at address input lines A0–A6 and thereby provides a signal indicative of that address to the column select activates a transistor set (similar to transistor set 20) to couple eight of the 1024 bit lines of memory array 30 to eight sense amplifiers (not shown) in a manner consistent with that described above with reference to FIG. 1.

A row predecoder circuit 33 and a row decoder circuit 34 operate cooperatively to drive a selected word line of memory array 30 in response to the eleven higher order bits of the address signal. Address input lines A7–A17 of row predecoder 33 are connected to receive these eleven higher order address bits. The row predecoder 33 includes four groups A, B, C, and D of output lines. Groups A, B and C each comprise eight separate output lines connected to row decoder 34, and group D comprises four separate output lines connected to row decoder 34. During operation, row predecoder 33 separately decodes the signals at address input lines A7–A9 and drives high one of the eight output lines of group A in response thereto. Row predecoder 33 simultaneously decodes the signals at address lines A10–A12 and drives high one of the eight output lines of group B in response thereto. Similarly, the signals at address lines A13–A15 are separately decoded by predecoder 33 to thereby drive high one of the eight output lines of group C. Finally, the signals at address lines A16 and A17 are decoded by row predecoder 33 to drive high one of the four output lines of group D.

Row decoder 34 decodes the signals received from the groups A–D of row predecoder 33 and responsively drives high one of the 1024 word lines connected to memory array 30. Row predecoder 33 and row decoder 34 are designed in the specific configuration as described above to allow a simplified circuit layout. It is noted that the specific row decoding details described above are with reference to the preferred embodiment of the invention, and that a variety of other types of address decoding schemes could be implemented without departing from the spirit and scope of the invention.

Predecoder 33 also includes a disable line 33A which may be driven high for disabling the predecoder 33 under certain circumstances as explained below. When predecoder 33 is disabled, row decoder 34 does not drive high any of the 1024 word lines connected to memory array 30.

A redundancy control circuit 35 in accordance with the invention is next considered. Redundancy control circuit 35 includes a disable row decoder circuit 36, four sets of enable-disable circuits 37/A, 37/B, 37/C and 37/D, four sets of address select circuits 38/A, 38/B, 38/C, 38/D, and a redundant row decoder 39. The operation of and further details of the circuitry within redundancy control circuit 35 are explained more completely below with reference to the following figures.

Each of the four sets of enable-disable circuits 37/A through 37/D include two enable-disable circuits. That is, set 37/A includes enable-disable circuits 37/A1 and 37/A2, set 37/B includes enable-disable circuits 37/B1 and 37/B2, set 37/C includes enable-disable circuits 37/C1 and 37/C2, and set 37/D includes enable-disable circuits 37/D1 and 37/D2. Each enable-disable circuit has an associated output line connected to a separate section I–IV of redundant row decoder 39.

Figure 3:
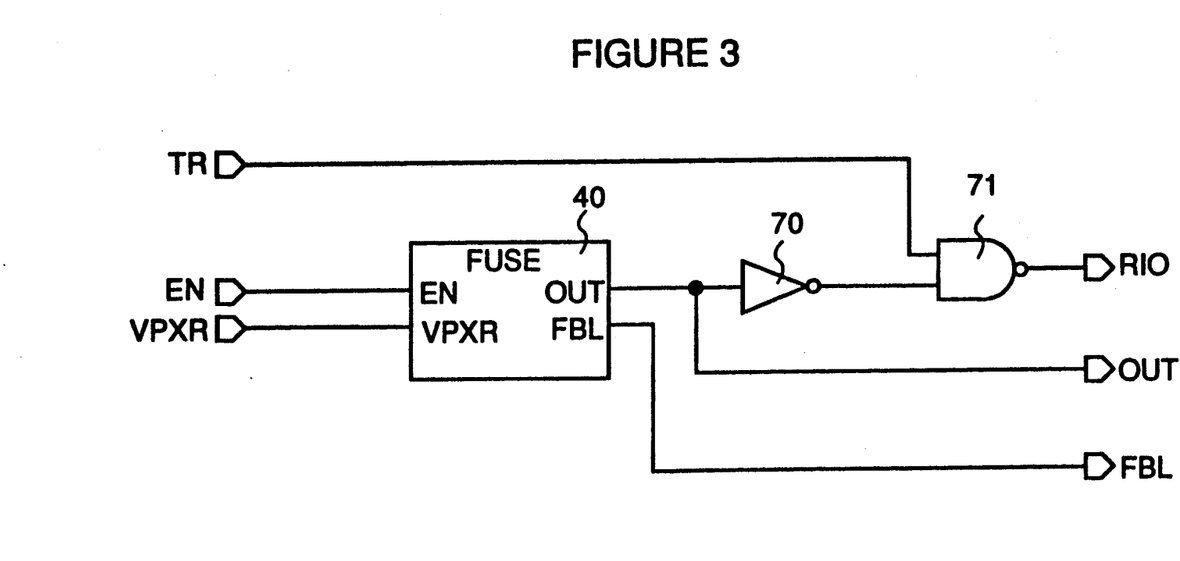
FIG. 3 is a schematic diagram of an enable-disable circuit incorporated within one embodiment of the invention.

Referring to FIG. 3, a circuit diagram of an enable-disable circuit is shown that is representative of each of the enable-disable circuits 37 of FIG. 2, i.e., 37/A1, 37/A2, 37/B1, etc. The enable-disable circuit comprises a "fuse" circuit block 40, an inverter 70, and a NAND gate 71. Fuse circuit 40 is a programmable circuit that is selectively programmed to provide either a high signal at the OUT terminal for certain circumstances or a low signal at the OUT terminal for other circumstances as described below.

Fuse circuit 40 is programmed by applying appropriate signals to the VPXR and FBL terminals, as will be appreciated in the following description. In addition, the state to which fuse circuit 40 is programmed can be tested by applying a high logic signal to the TR terminal which thus enables a test mode. If the OUT terminal of fuse circuit 40 is programmed high, then the RIO output terminal is low during the test mode (when TR is high). If the OUT terminal is low, then the RIO output terminal is high during the test mode. The TR terminal, the RIO terminal, inverter 70, and NAND gate 71 are provided to allow a programmer to verify the programmed state of fuse circuit 40, and it should not be inferred that their inclusion in the preferred embodiment limits the scope of the invention.

Other operating details of fuse circuit 40 are explained in detail below. It should first be recognized, however, that the memory chip within which the enable-disable circuits 37 are incorporated has an enabled mode and a stand-by mode. In application, as is typical for most memory chips, a microprocessor coupled to the memory chip generates a chip select pulse that sets the memory chip in the enabled mode when data must be read. This chip select pulse is received at the EN terminal to control operation of each enable-disable circuit 37, and is additionally received by other circuitry within the memory chip. The power consumed by the memory chip is much less during stand-by mode compared to that consumed during the enabled mode. Although the preferred embodiment of the fuse circuit 40 is incorporated within a specific memory chip having a stand-by mode and an enabled mode, the fuse circuit 40 may be employed within various other types of memory chips which include redundancy circuitry without departing from the scope of the invention.

Figure 4:
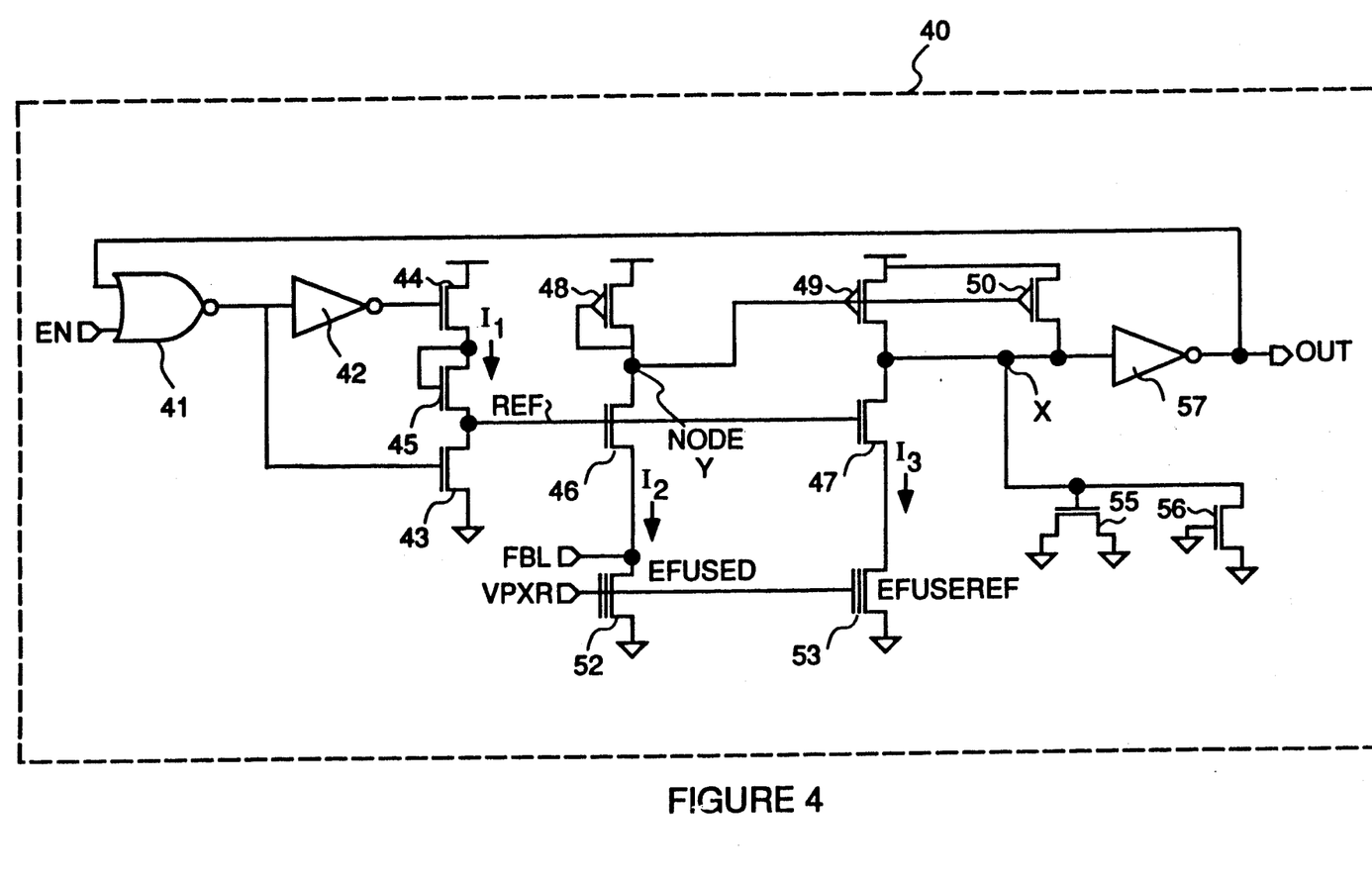
FIG. 4 is a schematic diagram of a fuse circuit incorporated within each enable-disable circuit and within each address select circuit.

Referring next to FIG. 4, a detailed schematic diagram of fuse circuit 40 is shown. The fuse circuit 40 comprises a NOR gate 41 having an input line labeled EN and an input line connected to an output line of the fuse circuit 40 labeled OUT. The output line of NOR gate 41 is connected to an inverter 42 and to an N-channel field effect transistor 43. Inverter 42 and transistor 43 are further connected to N-channel field effect transistors 44 and 45, respectively. A line labeled REF connects transistors 43 and 45 to the gates of a pair of field effect transistors 46 and 47. Transistor 46 is connected to a pair of P-channel field effect transistors 48 and 49, and transistor 47 is connected to P-channel field effect transistors 47 and 50 at node X.

The fuse circuit 40 further comprises a pair of floating gate field effect transistors 52 and 53 connected to transistors 46 and 47 respectively. Finally, N-channel field effect transistors 55 and 56 and an inverter 57 are also connected to node X.

Operation of the fuse circuit 40 specifically is first considered for the situation during which the memory chip is in stand-by mode and when the redundancy row is not selected. During stand-by mode operation, the voltage on the input line EN (coupled to the chip select line of a microprocessor) is low. When the redundant row is not selected, transistors 52 and 53 are erased. That is, if a particular redundant row is not required to replace a defective row of memory array 30, the chip manufacturer does not program transistor 52. The threshold voltages of transistors 52 and 53 are therefore low and hence a low impedance current path is established from the drain to the source of each device 52 and 53. Fuse circuit 40 is fabricated such that the pull-up of transistor 49 is stronger (approximately twice) than the pull-up of transistor 48. Initially when the memory chip goes into stand-by mode, since the pull-up of transistor 49 is stronger than the pull-up of transistor 48, the voltage at node X is pulled higher relative to the voltage at node Y. The lower voltage at node Y drives the gates of P-channel transistors 49 and 50, which thus turns them on stronger. The high voltage at node X is inverted by inverter 57 and therefore the voltage at the OUT terminal is low. When the OUT terminal is low, the redundancy row is not selected.

It should be noted that since the OUT terminal is low and the input voltage at the EN terminal is low during the stand-by mode when redundancy is not selected, the output voltage from NOR gate 41 is high. Transistor 43 is therefore turned on. In addition, since the output of inverter 42 is low, transistor 44 is turned off. Consequently, the current $I_1$ flowing through the transistors 43-45 is negligible. Furthermore, since transistor 44 is biased off, the voltage at the REF line is low, and thus transistors 46 and 47 are forced off. With transistors 46 and 47 turned off, negligible current $I_2$ and $I_3$ flows through transistors 48 and 49, respectively, and therefore the voltage levels at nodes X and Y go to a high state. The fuse circuit 40 remains latched in this state during the stand-by mode when redundancy is not selected. Since negligible current $I_1$, $I_2$, and $I_3$ flows, fuse circuit 40 consumes essentially no power during the stand-by mode when redundancy is not selected.

When the memory chip is enabled by a chip select pulse from the microprocessor, a high voltage level is applied to the EN terminal. The output voltage of NOR gate 41 therefore goes low and transistor 43 turns off. In addition, transistors 44 and 45 also turn on. A voltage bias is therefore established at the REF line which turns on transistors 46 and 47. Again, since both transistors 52 and 53 are erased (redundancy not selected) and thus have low threshold voltages, current is allowed to flow through the devices. In addition, since transistor 49 is a stronger pull-up compared to transistor 48, node X goes high relative to node Y. Thus, the voltage at the OUT terminal is low.

It can be noted that during this enabled state of the memory chip, current $I_1$, $I_2$, and $I_3$ flows. However, this current is minimal in comparison to the overall active current of the memory chip in the enabled mode.

Operation of fuse circuit 40 when a redundant row is selected to replace a defective row in memory array 30 is next considered. In the case where the redundant row must be used in the place of a defective row, the manufacturer programs transistor 52. As a result, the threshold voltage of transistor 52 is high and thus a high impedance current path is established from the drain to the source of the device 52. Again using conventional circuit analysis, since transistor 52 does not allow current flow, the voltage at node Y is high. This high voltage turns off p-channel transistor 49. Since transistors 47 and 53 are biased on, the voltage at node X goes low. The low voltage at node X is inverted by inverter 57 and therefore the voltage at the OUT terminal goes high.

The high voltage at the OUT terminal is received at the input line of NOR gate 41, and therefore the output line of NOR gate 41 is low. The output line of NOR gate 41 is low both when the memory chip operates in the enabled mode (EN high) and when the memory chip operates in the stand-by mode (EN low). Therefore during both operating modes, transistor 43 is off and transistor 44 is on generating biases for transistors 46 and 47 and negligible current $I_1$ flows. In addition, current $I_2$ does not flow since transistor 52 is programmed. Finally, although transistor 47 is biased on, current $I_3$ does not flow since transistor 49 is biased off. The voltage at node X is hence low and the voltage at the OUT line is high.

Following from the above circuit analysis, it is noted that when a redundant row is selected during both the memory chip enabled mode and the memory chip stand-by mode, negligible power consumption occurs. Furthermore, negligible power consumption also occurs during stand-by mode when the redundant row is not selected. Finally, minimal power is consumed by fuse circuit 40 compared to the overall active power consumption when the redundant row is not selected in the enabled mode of the memory chip.

It is further mentioned here that, for the typical situation, transistor 52 within fuse circuit 40 is selectively programmed by the manufacturer of the memory chip. After the required state of each fuse circuit is determined, the manufacturer either programs or doesn't program transistor 52 accordingly. A metal shield thereafter covers transistor 52 to prevent erasing when exposed to ultraviolet light. If transistor 52 is implemented using $E^2PROM$ or flash memory technology, such a metal shield would be unnecessary. It is also appreciated that the metal shield is situated within the package of the integrated circuit chip.

Variations of fuse circuit 40 are possible without departing from the scope of the invention. For example, the conductor connected from the gate to the source of transistor 48 could alternatively be connected from the gate of transistor 48 to the source of transistor 48. Operation for such a configuration would be similar to that already described, and may result in improved stability in the latch circuit. In addition, transistors 55 and 56 could be replaced with discrete capacitors or could be entirely omitted without departing from the scope of the invention.

Referring back to FIG. 2, each enable-disable circuit is selectively programmed to either allow the selection of a redundant row by redundant row decoder 39 or to prevent the selection of a redundant row by redundant row decoder 39. As an example, if the chip manufacturer determines that a particular row of memory array 30 is defective, enable-disable circuits 37/A1 and 37/A2 may be programmed in a manner described below to allow section I of redundant row decoder 39 to enable the associated redundant row. For this case, transistor 52 of enable-disable circuit 37/A1 is programmed while transistor 52 of enable-disable circuit 37/A2 is erased. As such, the output line from enable-disable circuit 37/A1 is high while the output line from enable-disable circuit 37/A2 is low. Section I of redundant row decoder 39 is therefore allowed to select the associated redundant row if certain conditions of address select circuit 38/A are also met. These details will be further understood with reference to the following figures and description.

If the redundant row corresponding to section I of redundant row decoder 39 is determined by the manufacturer to be defective, the selection of the redundant row after programming as described above can be disabled by programming high the output line of enable-disable circuit 37/A2. The manufacturer can thereafter program the associated circuitry of another section II-IV to select a different redundant row.

Consider next each set 38/A, 38/B, 38/C, and 38/D of the address select circuits as shown in FIG. 2. Each set 38/A, 38/B, 38/C, and 38/D includes eleven separate address select circuits 38, i.e., 38/A1-38/A11, 38/B1-38/B11, etc., and each is provided to program the address to which a particular redundant row of memory array 30 corresponds.

Figure 5:
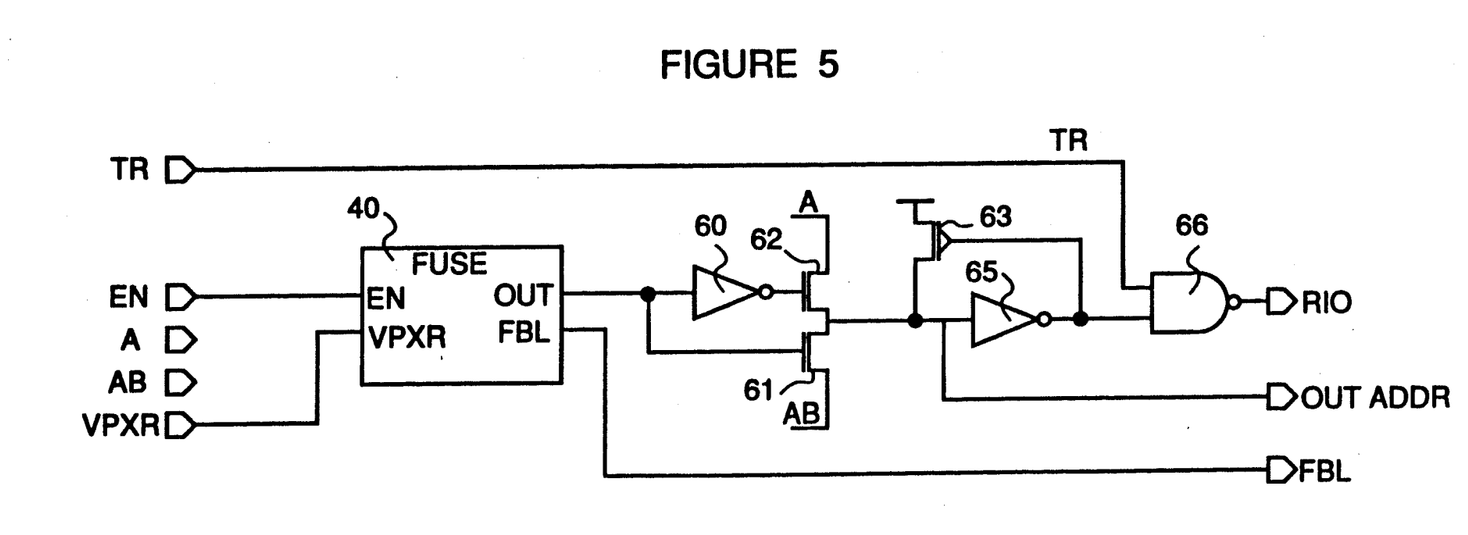
FIG. 5 is a schematic diagram of an address select circuit incorporated within one embodiment of the invention.

Referring to FIG. 5, an address select circuit is shown that is representative of each of the address select circuits 38 of FIG. 2. The address select circuit incorporates fuse circuit 40 that is connected at its OUT terminal to an inverter 60 and to an n-channel field effect transistor 61. Inverter 60 is further connected to a second n-channel field effect transistor 62. Transistors 61 and 62 are connected to a p-channel field effect transistor 63 and to a second inverter 65. Finally, a NAND gate 66 is connected to inverter 65.

A separate address select circuit 38 as shown in FIG. 4 is connected to each address line A7-A17 of the memory chip for each redundant row. Since the embodiment of the memory chip has eleven row address lines A7-A17 and four redundant rows, a total of forty-four address select circuits 38 are shown.

As explained earlier, the OUT terminal of the fuse circuit 40 is low if the redundancy row or column is not selected and high if the redundancy row or column is selected. The terminal labeled A is connected to the corresponding address line, and the terminal labelled AB is connected to receive the complement of the voltage on the corresponding address line.

If the redundant row or column is not selected, the voltage at the OUT terminal is low and hence transistor 62 is on. The voltage at the terminal labelled OUT ADDR therefore is the same as the voltage on the address line A.

If the redundancy row or column is selected, the voltage at the OUT terminal is high and hence transistor 61 is on and transistor 62 is off. The voltage at the OUT ADDR terminal is therefore equal to the voltage on the complement address line AB.

Following from the above analysis, when redundancy is not selected, the address applied to the address line A is transferred to the OUT ADDR terminal. When redundancy is selected, the complement of the address applied to the address line A is transferred to the OUT ADDR terminal.

The eleven output lines from each of the four address select sets 38/A, 38/B, 38/C, and 38/D are connected to redundant row decoder 39. Each set of eleven output lines is received by a separate section I-IV of redundant row decoder 39. Each section I-IV of redundant row decoder 39 has an associated output line connected to a word line of a redundant row of memory array 3.

If a redundant row must be utilized to bypass a defective row within memory array 30, then one of the address select sets 38/A, 38/B, 38/C, or 38/D is programmed to provide logical high outputs of each of its eleven corresponding output lines to redundant row decoder 39 when the address lines A7-A17 correspond to the address of the defective row. The pair of enable-disable circuits 37 connected to the corresponding section I-IV of redundant row decoder 39 are also programmed such the output line of the associated enable circuit 37 is high and the associated disable circuit 37 is low.

When the section I-IV of redundant row decoder 35 receives the signals from the associated enable-disable circuit set 37/A, 37/B, 37/C or 37/D and from the associated address select set 38/A, 38/B, 38/C or 38/D, the output line of the section I-IV is driven high to thereby drive the word line of the redundant row in memory array 30. Redundant row decoder 39 also provides a signal to disable row decoder circuit 36 which responsively provides a signal to disable the row predecoder 33A. The defective row of memory array 30 is thereby disabled, and a redundant row is enabled in its place. Due to the design of the redundancy control circuit 35, little or no access time degradation occurs when utilizing the redundant row. Furthermore, minimal power is consumed by the redundancy control circuit 35.

Figure 6:
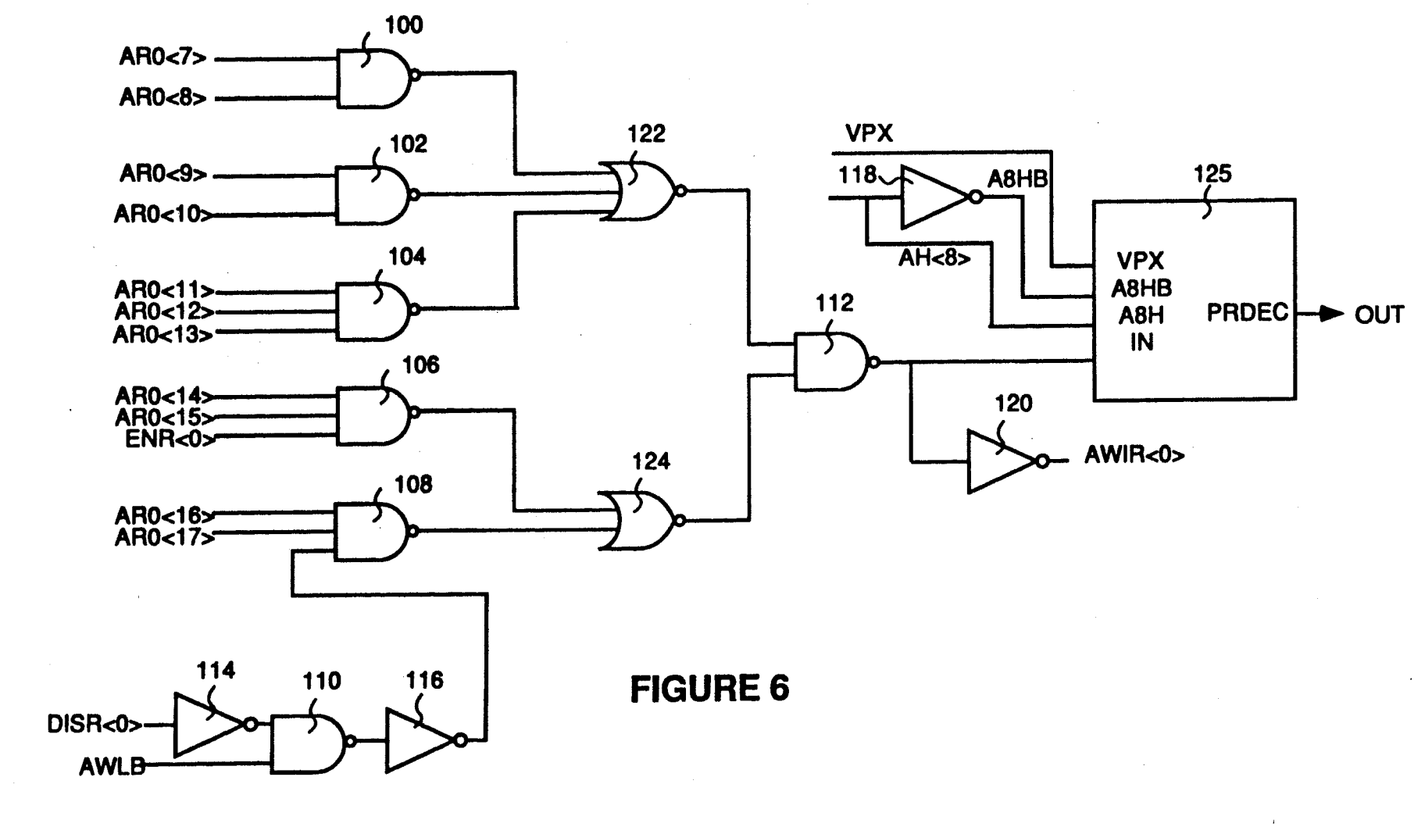
FIG. 6 is a schematic diagram of a section of a redundant row decoder circuit.

Referring next to FIG. 6, a circuit is shown that is incorporated within each section I-IV of redundant row decoder 39. The circuit includes NAND gates 100-112, inverters 114-120, NOR gates 122-124, and a circuit 125 labelled PRDEC. The eleven output lines from the corresponding address select set 38/A, 38/B, 38/C, or 38/D are connected to input lines ARO<7->-ARO<17>. The pair of output lines from the corresponding enable-disable circuit set 37/A, 37/B, 37/C, or 37/D are connected to the input line ENR<0> and DISR<0>. The AWLB terminal is an additional terminal used for testing redundant row decoder 39. During normal operation, a high signal is applied to the AWLB terminal.

During operation, if an address is provided which corresponds to a defective row and to the address programmed by an address select set 38/A-38/D, then the corresponding input lines ARO<7>-ARO<17> are each driven high. In addition, the associated enable-disable circuit 37 connected to the ENR<0> line is programmed to drive the ENR<0> line high, while the associated enable-disable circuit 37 connected to the DISR<0> line is programmed to drive the DISR<0> line low. In response, the output line of NAND gate 112 goes low.

Figure 7:
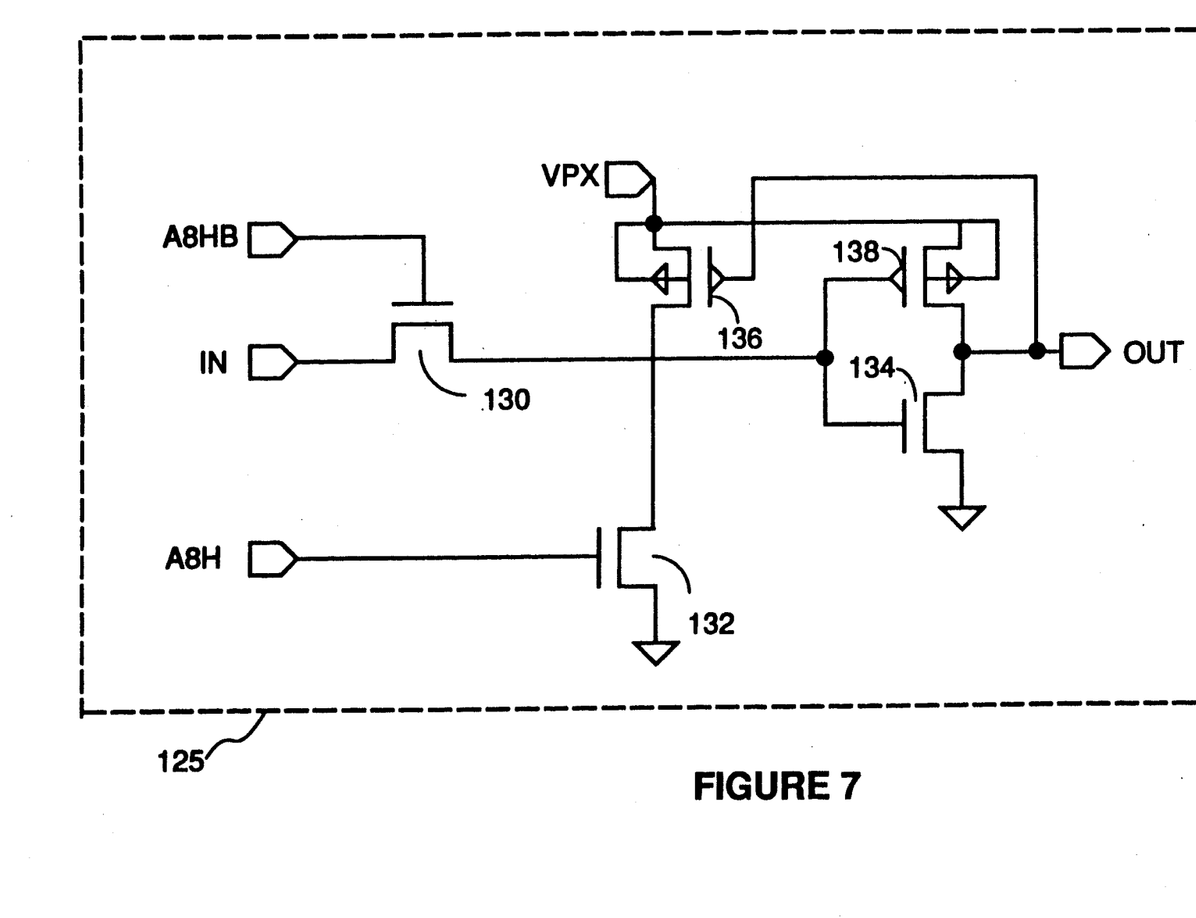
FIG. 7 is a schematic diagram of a redundant row programming circuit.

FIG. 7 shows a schematic of the circuit 125. Circuit 125 comprises N-channel field effect transistors 130-134 and P-channel field effect transistors 136-138. During normal operation, when the IN line of circuit 125 goes low, the OUT line goes high. The OUT line is connected to the associated word line of memory array 30, and thus the redundant row is activated.

Circuit 125 is provided to allow programming of each cell within the redundant row of memory array 30. During normal operations as described above, the A8AD and VPX terminals are each biased with approximately 5 volts. In addition, the A8H terminal is biased with approximately zero volts. Thus, when a low signal is provided to the IN terminal, a voltage level of approximately 5 volts is driven at the OUT line.

When a cell within the redundant row must be programmed, the VPX terminal is biased with approximately 12 volts. If the input signal at the IN terminal is high (5 volts), then both transistors 134 and 138 are turned on and the OUT terminal is low. When the input signal at the IN terminal is low, then transistor 134 is off and transistor 138 is on. The voltage level at the OUT terminal thus rises to approximately 12 volts, which is thereby sufficient to program the selected cell within the redundant row.

Inverter 120 shown in the circuit of FIG. 6 functions as a disable row decoder 36. The output line AWIR<0> of inverter 120 is connected to line 33A of row predecoder 33 and is low when the corresponding redundant row is not selected. When the corresponding redundant row is selected, the output line AWIR<0> is high in accordance with the above discussion, and thus row predecoder 33 is disabled. The defective row is thereby also disabled.

The memory circuit described in accordance with the invention may alternatively include one or more redundant columns within memory array 30 instead of the redundant rows. For such an implementation, a redundant column decoder is connected to each redundant column to couple the redundant column to the sense amplifiers when data is being read. Address-select circuits 38 and enable-disable circuits 37 are accordingly coupled to the redundant column decoder in a manner consistent with the foregoing redundant row configuration.

Furthermore, an alternative configuration of the memory circuit within the scope of the invention includes both redundant rows and redundant columns, with associated redundant row and column decoders and control circuitry as described.

It will be appreciated to those skilled in the art that significant access time increases are avoided as a result of the present invention since time is not expended to enable the redundant row or column after the initial assertion of the chip select pulse.

Numerous modifications and variations will become apparent to those skilled in the art once the above disclosure is fully appreciated. It is to be understood that the above detailed description of the preferred embodiment is intended to be merely illustrative of the spirit and scope of the invention and should not be taken in a limiting sense. The scope of the claimed invention is better defined by reference to the following claims.

I claim:

1. A control circuit for enabling a reading operation of a plurality of redundant cells in a memory circuit, the memory circuit having an array of memory cells and a memory array decoding circuit coupled to said memory array and connectable to a plurality of addressing lines, said control circuit comprising:
    a redundant cell decoding circuit coupled to said plurality of redundant cells for providing a select signal to said redundant cells;
    an address select circuit coupled to said redundant cell decoding circuit and connectable to said plurality of addressing lines, said address select circuit including a first means for programming said address select circuit to provide an address select signal to said redundant cell decoding circuit in response to an address signal at said addressing lines;
    an enable-disable circuit coupled to said redundant cell decoding circuit having a second means for programming said enable-disable circuit to provide an enable signal to said redundant cell decoding circuit;
    wherein said first means for programming said address select circuit is a first programmable fuse circuit and wherein said means for programming said enable-disable circuit is a second programmable fuse circuit and wherein each of said first and second programmable fuse circuits include:
    a first programmable element;
    an enable input line coupled to said first programmable element for receiving a chip select pulse; and
    an output line coupled to said first programmable element;
    wherein a first voltage level is latched at said output line when said first programmable element is programmed in a first state, and wherein a second voltage level is latched at said output lien when said first programmable element is programmed in a second state.

2. The control circuit as recited in claim 1 further comprising a disable decoder circuit for disabling said memory array decoding circuit when said redundant cell decoding circuit provides said select signal to said redundant cells.

3. The control circuit as recited in claim 1 wherein said first voltage level is latched at said output line before and after an assertion of said chip select pulse.

4. The memory circuit according to claim 1 wherein the access time of said memory when reading from a redundant memory cell is less than or equal to the access time of said memory when reading from a non-redundant memory cell.

* * * * *